(12) United States Patent
Graumann et al.

(10) Patent No.: US 9,473,175 B1
(45) Date of Patent: Oct. 18, 2016

(54) FORWARD ERROR CORRECTION DECODER SYSTEM

(71) Applicant: PMC-SIERRA US, INC., Sunnyvale, CA (US)

(72) Inventors: Peter Graumann, Calgary (CA); Sean G. Gibb, Calgary (CA); Jonathan Eskritt, Airdrie (CA)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 38 days.

(21) Appl. No.: 14/618,583

(22) Filed: Feb. 10, 2015

(51) Int. Cl.
*H03M 13/00* (2006.01)
*H03M 13/11* (2006.01)

(52) U.S. Cl.
CPC ................... *H03M 13/1111* (2013.01)

(58) Field of Classification Search
None
See application file for complete search history.

(56) References Cited

U.S. PATENT DOCUMENTS

| | | | | |
|---|---|---|---|---|
| 8,291,292 B1* | 10/2012 | Varnica | ............... | H03M 13/1114 714/758 |
| 8,935,598 B1* | 1/2015 | Norrie | ............... | H03M 13/6583 375/262 |
| 8,984,376 B1* | 3/2015 | Norrie | ............... | H03M 13/1142 714/772 |
| 2007/0220398 A1* | 9/2007 | Moon | ............... | H03M 13/1131 714/758 |
| 2012/0213231 A1* | 8/2012 | Barr | .................... | H04L 12/2801 370/431 |
| 2013/0061114 A1* | 3/2013 | Malmirchegini | .. | H03M 13/1117 714/763 |

FOREIGN PATENT DOCUMENTS

WO     2006055175     5/2006

OTHER PUBLICATIONS

Ragini et al., "Companding Technique for Reducing Peak-to-Average Power Ratio in OFDM Linear Coded Systems", International Journal of Power System Operation and Energy Management ISSN (Print), 2012, vol. 1, Issue 4, 5 pages.

* cited by examiner

*Primary Examiner* — Daniel McMahon
(74) *Attorney, Agent, or Firm* — Dennis R. Haszko

(57) ABSTRACT

Forward error correction (FEC) decoders, such as Low Density Parity Check (LDPC) decoders are described. Described FEC decoders minimize the number of internal bits in a layered processor of an LDPC decoder while maintaining high coding gain operation of the LDPC decoder. Minimizing the number of internal bits in a layered processor is achieved by non-linearly companding the soft information into lower precision format while maintaining the dynamic range of the data bits. Described FEC decoders may generate updated soft information having a precision that is equal to the channel precision.

15 Claims, 5 Drawing Sheets

FORWARD ERROR CORRECTION DECODER SYSTEM

FIELD

The present disclosure relates generally to forward error correction (FEC) decoder systems. More particularly, the present disclosure relates to power consumption and area in FEC decoder systems including, but not limited to, layered low density parity check (LDPC) decoder systems.

BACKGROUND

Low Density Parity Code (LDPC) decoder systems are current generation iterative soft-input forward error correction (FEC) decoder systems that have found increasing popularity in FEC applications where low error floor and high performance are desired. LDPC codes are defined in terms of a two-dimensional parity-check matrix, referred to as an H matrix, that represents a set of parity check equations such that cH=0 where c is a codeword of the LDPC code.

An H matrix is a low-density matrix that can be represented by a sparse bipartite graph, known as a Tanner graph. A Tanner graph includes check nodes and variable nodes (otherwise known as bit nodes). For LDPC codes, the check nodes denote rows of the H matrix and the variable nodes represent the columns of the H matrix. An edge of the Tanner graph connects a check node to a variable node if a nonzero entry (i.e., a one) exists in the intersection of the corresponding row and column of the H matrix.

Decoding an LDPC code requires solving a set of parity check equations according to the H matrix. A commonly used decoding method is based on a two-step iterative process that uses soft decisions and is based on the belief propagation method. The process starts by loading the soft values of a LDPC code, such as log-likelihood ratios (LLRs) of a LDPC code, into the variable nodes. In the first half-iteration, each check node takes the output of the connected neighboring variable nodes and calculates a soft value. In the second-half iteration, the soft value at each variable node is updated by combining the soft value at the particular variable node (the variable node information) with the soft values output by the connected neighboring check nodes (the extrinsic information) for use in the subsequent iteration.

A common method for calculating the check node output is the min-sum method, including modified versions thereof such as attenuated min-sum methods or adjusted min-sum methods. In the min-sum method, the magnitude of the check node output is calculated by determining the minimum magnitude of all of the connected neighboring variable nodes and the sign of the check node output is calculated as the one bit binary multiplication of the signs of the connected neighboring variable nodes.

Soft-decoding an LDPC code causes convergence of the solved LDPC code with the true LDPC code for most communication channels. Convergence is achieved over a number of iterations of the two-step iterative process described above and results in a corrected LDPC code without errors.

A category of LDPC codes, known as quasi-cyclic (QC) codes, generates an H matrix with features that improve the ease of implementing an LDPC encoder and decoder.

Current LDPC decoders that perform soft-decision decoding to decode an LDPC codeword require a large memory and significant processing power to decode the LDPC codeword.

Improvements to the layer processing of LDPC codes that reduces the memory size of the LDPC decoder and processing power required to decode the LDPC codeword are therefore desirable.

DETAILED DESCRIPTION

Figure 1:
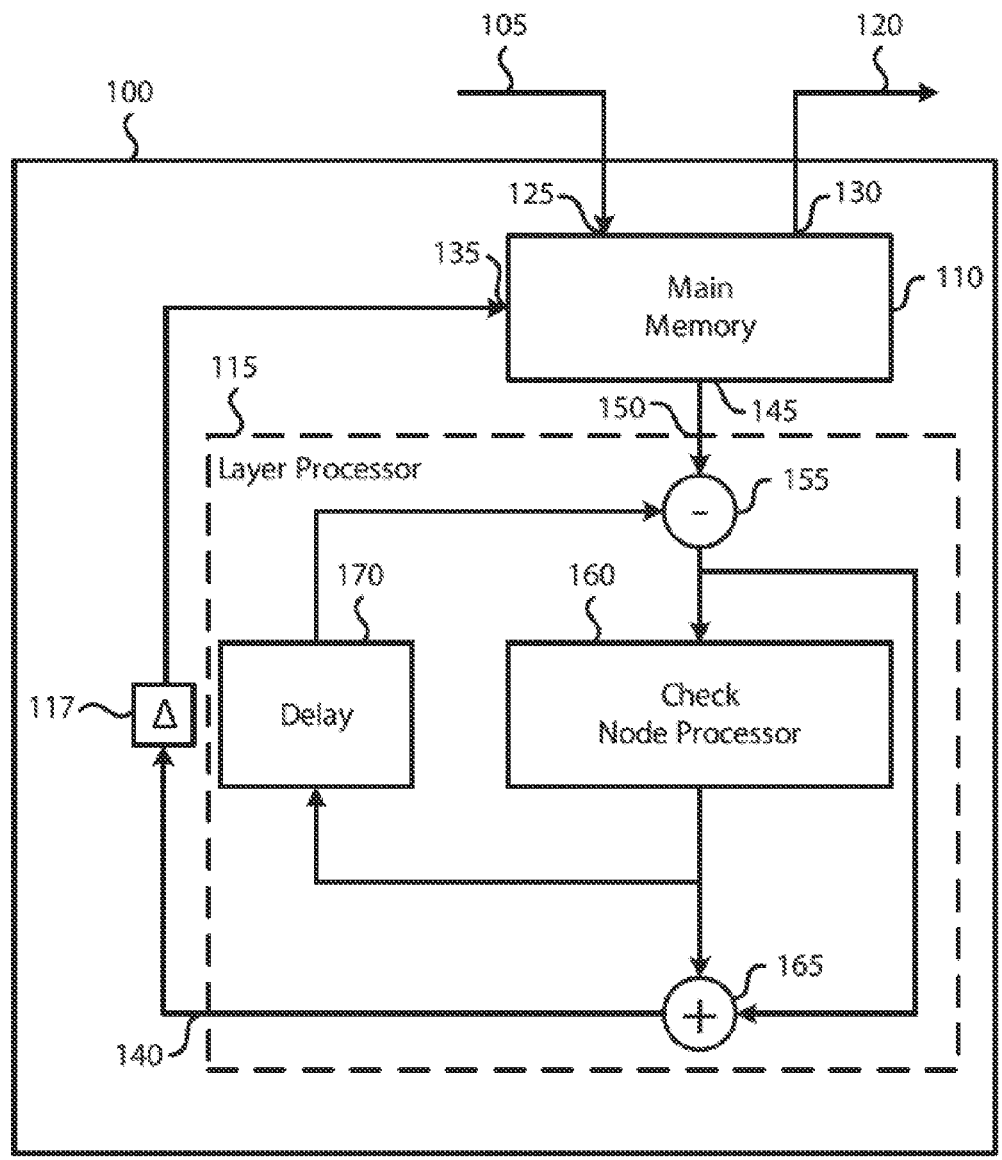
FIG. 1 is a block diagram illustrating a known architecture of an iterative LDPC decoder system.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

The present disclosure generally relates to forward error correction (FEC) decoders. More particularly, the present disclosure relates to FEC decoders such as layered low density parity check (LDPC) decoders, flood scheduled LDPC decoders, and Turbo decoders. Implementations described herein minimize the number of internal bits in a layered processor of an LDPC decoder while maintaining high coding gain operation of the LDPC decoder. In an implementation, this is achieved by non-linearly companding the soft information into lower precision format while maintaining the dynamic range of the data bits. In an implementation, updated soft information has a precision that is equal to the channel precision.

In soft-decision decoding, the bit widths of the nodes in an LDPC decoder system, hereinafter referred to as the node precision, are implemented wider than the bit width of the input data received from a channel to allow the summation of the input data from the channel with the extrinsic information. The bit widths of the nodes are bounded to some number of bits that is larger than the bit width of the input data from the channel, for example two or three extra bits, for Log-Likelihood Ratio (LLR) growth. Because the bit widths of the nodes are bounded to some number of bits that is larger than the bit width of the input data received from a channel, a large memory is required to store the larger number of bits and significant processing power is required to decode the LDPC code. The present disclosure provides an improved LDPC decoder system which reduces a memory size of the FEC decoder system and the processing power required to decode a LDPC code. Additionally, the present disclosure relates to a companding architecture within a layered LDPC decoder.

In an embodiment, the present disclosure provides a Low Density Parity Check (LDPC) decoder comprising: a main memory for storing raw data received from a channel as soft information, the raw data received from the channel having a channel precision; and one or more layer processors. Each of the one or more layer processors being operably coupled to the main memory and comprising: an input for receiving the soft information from the main memory, the soft information having an input precision that is equal to the channel precision; a delay element for storing extrinsic information; a subtractor configured to subtract extrinsic information stored in the delay element from the soft information received from the main memory to generate variable node information, the variable node information having a precision that is less than or equal to the channel precision; a check node processor configured to receive the variable node information from the subtractor and to calculate updated extrinsic information using a belief propagation method, the updated extrinsic information having a precision that is less than or equal to the channel precision; an adder configured to combine the variable node information received from the subtractor with the updated extrinsic information received from the check node processor to generate updated soft information; a selector configured to: in response to receipt of an overflow signal from the adder, feedback a bitwise inversion of the variable node information received from the subtractor to the delay element for storage therein; absent receipt of the overflow signal from the adder, feedback the updated extrinsic information to the delay element for storage therein; and an output for providing the updated soft information received from the adder to the main memory to replace the soft information stored in the main memory, the updated soft information having a precision that is equal to the channel precision.

In an example embodiment, each of the one or more layer processors further comprises: a first saturation element configured to receive variable node information from the subtractor and to limit the precision of the variable node information such that the precision of the variable node information equals the channel precision.

In an example embodiment, each of the one or more layer processors further comprises: a second saturation element configured to receive the updated soft information from the adder and to limit the precision of the updated soft information such that the precision of the updated soft information equals the channel precision.

In an example embodiment, the selector of each of the one or more layer processors comprises: a third saturation element operably coupled to an output of the subtractor and configured to limit the precision of the variable node information received from the subtractor such that the precision of the variable node information equals the channel precision; an inverter operably coupled to an output of the third saturation element and configured to perform the bitwise inversion of the variable node information received from the third saturation element; and a multiplexor operably coupled to the check node processor, the inverter and the adder and configured to: in response to receipt of the overflow signal from the adder, output the bitwise inversion of the variable node information received from the third saturation element; and absent receipt of the overflow signal from the adder, output the updated extrinsic information.

In an example embodiment, each of the one or more layer processors further comprises: a first expander configured to non-linearly expand the extrinsic information received from the delay element such that the precision of the extrinsic information received from the delay element is equal to the channel precision; a first compander configured to: non-linearly compand the variable node information received from the subtractor such that a precision of the variable node information is less than the channel precision; and forward the non-linearly companded variable node information to the check node processor; a second expander configured to non-linearly expand the updated extrinsic information received from the check node processor such the precision of the updated extrinsic information is equal to the channel precision.

In an example embodiment, the selector of each of the one or more layer processors comprises: a saturation element operably coupled to an output of the subtractor and configured to limit the precision of the variable node information received from the subtractor such that the precision of the variable node information equals the channel precision; an inverter operably coupled to the output of the saturation elements and configured to perform a bitwise inversion on the variable node information received from the saturation element; a second compander operably coupled to the inverter and configured to: non-linearly compand the bitwise inversion of the variable node information such that the bitwise inversion of the variable node information has a precision that is less than the channel precision; a multiplexor operably coupled to the check node processor, the second compander and the adder and configured to: in response to receipt of the overflow signal from the adder, output the non-linearly companded bitwise inversion of the variable node information received from the second compander; absent receipt of the overflow signal from the adder, output the non-linearly companded updated extrinsic information received from the check node processor.

In an embodiment, the present disclosure provides a method of decoding raw data received from a channel, the method comprising: storing the raw data in a main memory as soft information, the raw data having a channel precision; obtaining the soft information from the main memory, the soft information retrieved from the main memory having a precision that is equal to the channel precision; subtracting extrinsic information stored in a delay element from the soft information received from the main memory to generate variable node information, the variable node information having a precision that is less than or equal to the channel precision; processing the generated variable node information using a belief propagation method to obtain updated extrinsic information, the updated extrinsic information having a precision that is less than or equal to the channel precision; combining the variable node information with the updated extrinsic information to generate updated soft information; if combining the variable node information with the updated extrinsic information results in an overflow condition: saturating the variable node information to limit the precision of the variable node information to a maximum value; and storing a bitwise inversion of the maximum value of the variable node information; otherwise: storing the updated extrinsic information; and replacing the soft information stored in the main memory with the updated soft information, the updated soft information having a precision that is equal to the channel precision.

In an example embodiment, the method further comprises: saturating the received variable node information to limit the precision of the variable information such that the precision of the variable node information is equal the channel precision.

In an example embodiment, the method further comprises: saturating the updated soft information to limit the precision of the updated soft information such that the precision of the updated soft information is to equal the channel precision.

In an example embodiment, the method further comprises: non-linearly expanding the received extrinsic information such that a precision of the extrinsic information received from the delay element is equal to the channel precision; non-linearly companding the received variable node information such that a precision of the variable node information is less than the channel precision; non-linearly companding the bitwise inversion of the maximum value of the variable node information such that a precision of the bitwise inversion inverted maximum value of the variable node information is less than the channel precision; and non-linearly expanding the received updated extrinsic information such that the precision of the updated extrinsic information is equal to the channel precision; and wherein processing the generated channel information using a belief propagation method to obtain updated extrinsic information comprises processing the non-linearly companded variable node information to obtain non-linearly companded updated extrinsic information.

In another embodiment, the present disclosure provides a non-transitory computer-readable medium having computer-readable instructions stored thereon executable by a layered Low Density Parity Check (LDPC) decoder to perform a method of decoding raw data received from a channel that is stored in a memory as soft information, the raw data having a channel precision. The method comprises: obtaining the soft information from the main memory, the soft information retrieved from the main memory having a precision that is equal to the channel precision; subtracting extrinsic information stored in the delay element from the soft information received from the main memory to generate variable node information, the variable node information having a precision that is less than or equal to the channel precision; processing the generated variable node information using a belief propagation method to obtain updated extrinsic information, the updated extrinsic information having a precision that is less than or equal to the channel precision; combining the variable node information with the updated extrinsic information to generate updated soft information; if combining the variable node information with the updated extrinsic information results in an overflow condition: saturating the variable node information to limit the precision of the variable node information to a maximum value; and storing a bitwise inversion of the maximum value of the variable node information; otherwise: storing the updated extrinsic information; and replacing the soft information stored in the main memory with the updated soft information, the updated soft information having a precision that is equal to the channel precision.

In an example embodiment, the method performed by the instructions stored on the non-transitory computer-readable medium further comprises: saturating the received variable node information to limit the precision of the variable node information such that the precision of the variable node information is to equal the channel precision.

In an example embodiment, the method performed by the instructions stored on the non-transitory computer-readable medium further comprises: saturating the updated soft information to limit the precision of the updated soft information such that the precision updated soft information is to equal the channel precision.

In an example embodiment, the method performed by the instructions stored on the non-transitory computer-readable medium further comprises: non-linearly expanding the received extrinsic information such that a precision of the extrinsic information received from the delay element is equal to the channel precision; non-linearly companding the received variable node information such that a precision of the variable node information is less than the channel precision; non-linearly companding the received bitwise inversion of the maximum value of the variable node information such that a precision of the bitwise inversion of the maximum value of the variable node information is less than the channel precision; and non-linearly expanding the received updated extrinsic information such that the precision of the updated extrinsic information is equal to the channel precision; wherein processing the generated variable node information using a belief propagation method to obtain updated extrinsic information comprises processing the non-linearly companded variable node information to obtain non-linearly companded updated extrinsic information.

In a further embodiment, the present disclosure provides a Low Density Parity Check (LDPC) decoder comprising: a main memory storing raw data received from a channel as soft information, the raw data received from the channel having a channel precision; one or more layer processors, each of the one or more layer processors being operably coupled to the main memory and configured to: receive the soft information from the main memory; and iteratively decode the soft information such that, during the iterative decoding, the precision of the soft information received from the memory is equal to the channel precision and a precision of variable node information generated by the iterative decoding.

Referring to FIG. 1, a block diagram illustrating a known architecture of an iterative FEC decoder is shown. In the embodiment shown in FIG. 1, the FEC decoder is a layered LDPC decoder 100. The layered LDPC decoder 100 includes an input 105, a main memory 110, a plurality of layer processors 115 (though only one is shown in FIG. 1), and an output 120. A first delay, or inherent delay, 117 is shown in FIG. 1 to represent or model an inherent processing delay through the layer processor 115, and is not a delay that is added. The input 105 of the LDPC decoder 100 is connected to a first input 125 of the main memory 110. Similarly, the output 120 of the LDPC decoder 100 is connected to a first output 130 of the main memory 110. A second input 135 of the main memory 110 is connected to an output 140 of the layer processor and experiences the inherent delay 117. A second output 145 of the main memory 110 is connected to an input 150 of each layer processor 115.

Each layer processor 115 includes a subtractor 155, a check node processor 160, an adder 165, and a delay element 170, which may be referred to as a second delay element. Each of the layer processors 115 operate in parallel with one another.

The main memory 110 includes a plurality of memory storage elements (not shown). In an embodiment, each memory storage element is a two-port memory supporting one write and one read per clock cycle. In an embodiment, the two-port memory of each memory element is implemented as two-port register files. The second delay element 170 also includes memory storage elements.

In a first iteration of the decoding process, the LDPC decoder 100 receives noisy raw LLR data (hereinafter referred to as raw data) from the channel at the input 105 and routes the raw LLR data as soft information to the first input 125 for storage in the main memory 110, for example in a manner that avoids pipelines stalls. In subsequent iterations, the soft information stored in the main memory is replaced by the delayed soft information output by the layer processor 115.

In each of the iterations, the subtractor 155 in each layer processor 115 removes extrinsic information from the soft information stored in the main memory 110 to generate channel information for the respective layer in an H matrix currently being operated on. The check node processor 160 performs an approximation of the belief propagation method, such as the min-sum method described above, or its alternatives, and outputs extrinsic information. The adder 165 combines the extrinsic information output by the check node processor 160 with channel information for the layer and provides the combined extrinsic information and channel information as updated soft information and outputs the updated soft information via the output 140, which experiences the inherent delay 117; the delayed updated soft information is received by the memory 110 at the second input 135 and the memory 110 replaces the soft information stored therein with the updated soft information. The second delay element 170 feeds back the extrinsic information for processing in the next iteration.

The plurality of layer processors 115 are the dominant source of processing and power consumption in the iterative LDPC decoder 100. The iterative decoding process proceeds based on a specified H matrix until the decoding process has completed either by converging to a solution or running out of processing time.

Figure 2:
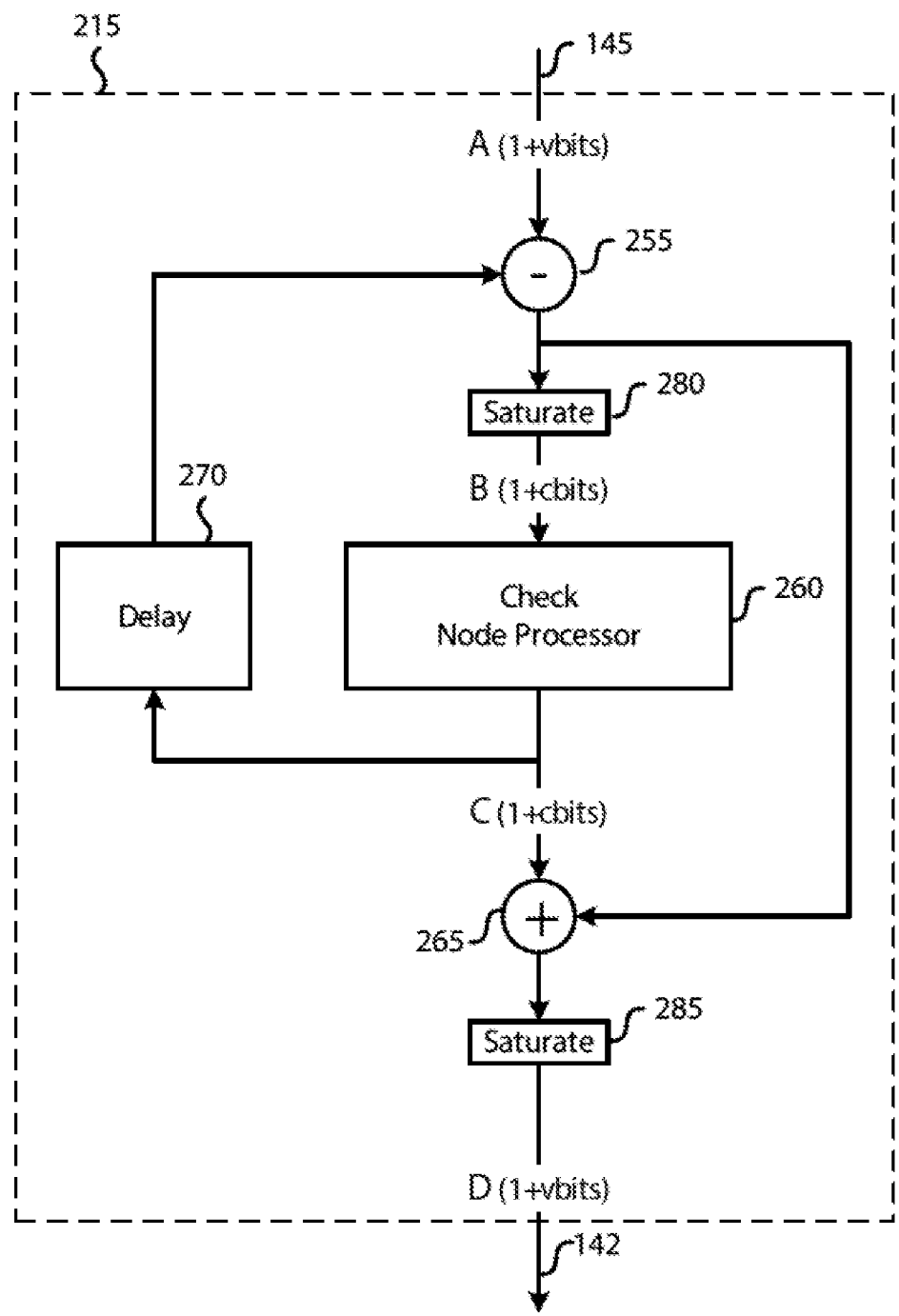
FIG. 2 is a block diagram illustrating another known architecture of a layered LDPC decoder of the iterative LDPC decoder system of FIG. 1.

FIG. 2 shows a block diagram illustrating another known architecture of a layer processor for use in an LDPC decoder, such as the iterative LDPC decoder 100 of FIG. 1. Although FIG. 2 only shows a single known layer processor 215 for ease of illustration, a person of ordinary skill in the art will recognize that LDPC decoder 100 of FIG. 1 would include a plurality of the known layer processors 215.

Similar to the layer processor 115 of FIG. 1, the layer processor 215 of FIG. 2 includes a subtractor 255, a check node processor 260, an adder 265, and a second delay element 270. Additionally, the layer processor 215 includes a first saturation element 280 and a second saturation element 285. The first saturation element 280 is connected to an output of the subtractor 255 and to the input of the check node processor 260. The second saturation element 285 is connected to an output of the adder 265. Location A in FIG. 2 is the output 145 from the main memory 110 shown in FIG. 1. Location D in FIG. 2 is the output 140 of the layer processor 215.

In the architecture of the layer processor 215 shown in FIG. 2, the input precision, vbits, of the magnitude for the layer processor 215 is typically larger than the actual LLR precision of the raw data from the channel to allow for bit growth in the layer processor 215. The subtractor 255 that removes current extrinsic information from the soft information in the main memory 110 can further increase the precision requirements of the input to the check node processor 260. In order to limit the bit width of the extrinsic information, a saturation operation is performed by the first saturation element 280 on the output of the subtractor 255, thereby generating an output with cbits precision at location B. One known approach to limiting the precision of the extrinsic information generated by the check node processor 260 is to perform all check node operations at the same precision as the LLR precision of the raw data from the channel. The first saturation element 280 brings the LLR value into an acceptable range for the check node processor 260 by hard capping all LLR values beyond the maximum LLR supported by the channel. Thus, the output of the check node processor 260 is at the same precision, cbits, as the input to the check node processor 260 at node C. The check node output LLR value represents the extrinsic information from this layer and is stored in delay element 270 for use in the next iteration of decoding. To avoid numeric instability, it is often favorable to ensure that the subtractor 255 does not overflow. To ensure that the subtractor 255 does not overflow, the output of the adder 265 at location D is saturated by a second saturation element 285 to a maximum magnitude of $(2^{vbits}-1)-(2^{cbits}-1)$.

The memory area in the second delay element 270 may be reduced by compressing the output of the check node processor 260 before it is stored in the second delay element 270. To ensure convergence of the iterative LDPC decoder 100, feedback from element 270 should be D—the output of subtractor 255. The feedback should represent the extrinsic information added by this layer to the overall LLR value in the system. Any error in the compressed delay value can lead to substandard convergence, or non-convergence of the iterative LDPC decoder 100. For the commonly used min-sum method, or modified min-sum, the output of the check node processor 260 may be compressed to store the first and second check node minimums, the index of the input to the check node processor 260 corresponding to the stored first minimum, and the sign of all of the outputs from the check node processor stored in the second delay element 270. In an example embodiment, check nodes typically have a check node order of Cn which, for example can be 16-64 for a check node having 16-64 inputs; the output sign for each of these would be stored in element 270. With these four variables, it is possible to regenerate the entire check node output.

Although this known compression method is memory efficient, a drawback of this known method is that it leads to unpacking complexity, for example wiring complexity, and routing congestion.

To reduce the power and area requirements of an implementation of an iterative LDPC decoder system 100, there are several considerations to be kept in mind. First, it is desirable to have minimal to no impact on the frame error rate performance of the code. Second, it is desirable to support a wide variety of code rates, such as code rates between 0.5 and 0.95, in a single circuit. Third, reducing logic area is more important than reducing memory area for power consumption saving. Finally, a desirable implementation results in a simple circuit that has low engineering development time overhead. By minimizing all precisions in each layer of a layered LDPC decoder 115, 215, it possible to reduce the physical area of the layered LDPC decoder 115, 215, the area of the delay memory 170, 270 in each layer of the layered LDPC decoder 115, 215, and the area of the main memory 110 used to store soft values between iterations of the decoding process.

Embodiments of the present disclosure provide an architecture for each layer processor of an iterative FEC decoder that provides one or more of the following: reduces the node precision in each layer processor of the iterative FEC decoder in order to save power; reduces a size of the first delay element in each layer processor; and reduces a size of the main memory of the FEC decoder without significantly negatively impacting the frame error rate performance of the iterative FEC decoder. In an embodiment of the present disclosure, the FEC decoder is an iterative LDPC decoder. Two example embodiments of a layer processor for a LDPC decoder described herein are suitable for achieving these results. In a first embodiment, all of the various node precisions of the layer processor of the LDPC decoder are selected to be at the input precision (i.e. the precision of the raw data received from the channel), which advantageously reduces the area of the main memory and the power utilized by the layer processor. In a second embodiment, the layer processor utilizes a novel companding architecture to further reduce the area of the memory storage elements of the second delay element 270 of the layer processor. In both embodiments, the layer processor can also include a circuit that ensures that the frame error rate performance of the iterative LDPC decoder is maintained.

Figure 3:
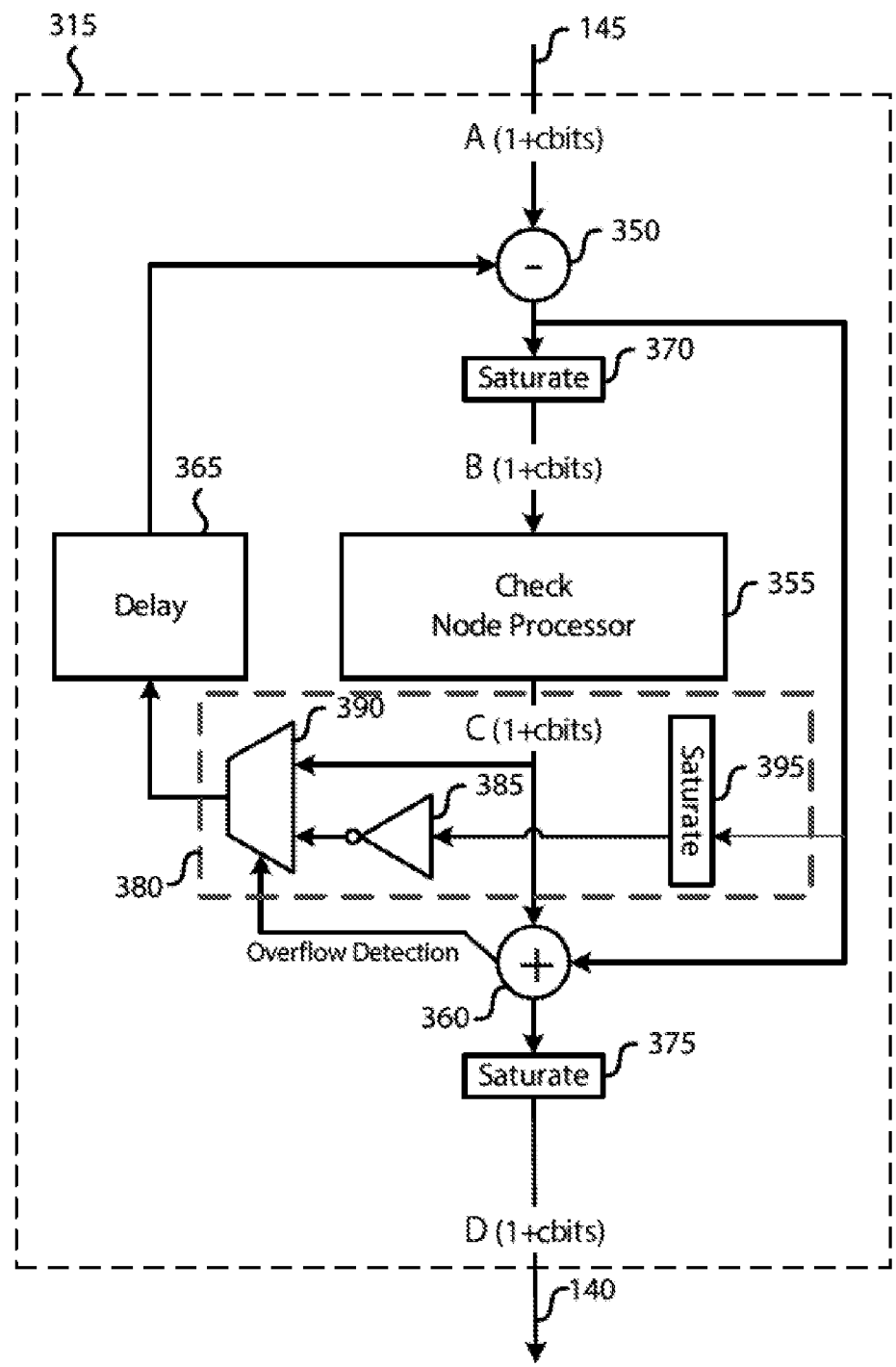
FIG. 3 is a block diagram illustrating a layered LDPC decoder of an iterative LDPC decoder system in accordance with an embodiment of the present disclosure.

FIG. 3 is a block diagram illustrating a layer processor 315 of an iterative LDPC decoder in accordance with an embodiment of the present disclosure. Although FIG. 3 only shows a single layer processor 315 for ease of illustration, a person of ordinary skill in the art will recognize that an iterative LDPC decoder can include one or more layer processors 315, and in some cases a plurality of layer processors 315. In an example implementation, a single layer processor is provided in an LDPC decoder for lower bandwidth applications.

The layer processor 315 includes a subtractor 350, a check node processor 355, an adder 360, a delay element 365, a first saturation element 370, and a second saturation element 375. Additionally, the layer processor 315 includes a selector 380 that comprises an inverter 385, a multiplexor 390 and a third saturation element 395. The selector 380 has three inputs and one output. The adder 360 has two inputs and two outputs.

An output of the check node processor 355 is operably connected to a first input of the selector 380, which in turn is operably connected to a first input of the multiplexor 390. An output of the subtractor 350 is operably connected to a second input of the selector 380, which in turn is operably connected to an input of the third saturation element 395. An overflow output of the adder 360 is operably connected to a third input of the selector 380, which in turn is operably connected to a select input of the multiplexor 390.

The first input of the selector 380 is connected to an output of the multiplexor 390, which in turn is operably connected to a first input of the adder 360. A second input of the adder 360 is operably connected to the output of the subtractor 350. A second output of the adder 360 is operably connected to the second saturation element 375. An output of the second saturation element 375 is operably connected to the output 140 of the layer processor 315.

As mentioned above, the selector 380 includes the third saturation element 395, the inverter 385, and the multiplexor 390. The third saturation element 395 has an output that is operably connected to an input of the inverter 385, and the inverter 385 has an output that is operably connected to a second input of the multiplexor 390.

The operation of the layer processor 315 will now be described. The layer processor 315 receives soft information from the second output 145 of the main memory 110 at location A. The precision of the soft information has a precision that is equal to the precision of the raw data received by the channel (i.e., the channel precision). The subtractor 350 subtracts the soft information received from the main memory 110 from extrinsic information stored in the delay element 365 to generate variable node information that is provided to the first saturation element 370. The first saturation element 370 receives the variable node information from the subtractor 350 and limits the precision of the variable node information to equal the precision of the raw data received from the channel (i.e., the channel precision).

The check node processor 355 receives the variable node information from the first saturation element 370 and calculates updated extrinsic information for the respective layer in an H matrix currently being operated on using a belief propagation method. The adder 360 receives the variable node information from the subtractor 350 and the updated extrinsic information from the check node processor 355 and combines the variable node information with the updated extrinsic information to generate updated soft information.

The second saturation element 375 receives the updated soft information from the adder 360, limits the precision of the updated soft information to equal the precision of the raw data received from the channel (i.e., the channel precision), and outputs the updated soft information via the output 140 to replace the soft information stored in the main memory 110. The third saturation element 395 receives the variable node information from the subtractor 350 and limits the variable node information to a maximum value that can be used in this layer processor 315, i.e., $2^{cbits}$ minus the value at location B minus 1. The inverter 385 performs a bitwise inversion on the variable node information received from the saturation element 395 and provides the bitwise inverted, variable node information to the multiplexor 390.

Combining the variable node information with the updated extrinsic information can cause the adder 360 overflow. When the adder 360 overflows, the adder 360 generates an overflow signal. In response to receipt of the overflow signal from the adder 360, the multiplexor 390 feeds back the bitwise inverted variable node information to the delay element 365 for storage therein. Otherwise, absent receipt of the overflow signal from the adder 360, the multiplexor 390 feeds back the updated extrinsic information received from the check node processor 355 to the delay element 365 for storage therein.

As mentioned above with respect to FIG. 2, in the known architecture of the layer processor 215, cbits is the number of magnitude bits in the raw data (i.e. the channel precision), vbits is the number of magnitude bits in the soft information received from the main memory 110 (i.e., the input precision), and vbits is in the order of 2 to 3 bits more than cbits (i.e. vbits=cbits+2). In contrast, in the architecture of the layer processor 315 of the present disclosure, the precision of the soft information received from main memory 110 at location A (i.e., the input precision) and the precision of the updated soft information output by the layer processor 315 (i.e., at location D) are equal to the channel precision. In other words, vbits=cbits. An advantage of the architecture of the layer processor 315 shown in FIG. 3 is that the area requirements for the main memory 110 and power usage of the main memory 110 are reduced. For example, the known layer processor 215 of FIG. 2, where cbits=4 and vbits=6, requires 30% more physical area and power in the main memory than the layer processor 315 of an embodiment of the present disclosure, where cbits=vbits=4. The subtractor 370 and the adder 375 in the layered LDPC decoder 315 are also vbits minus cbits smaller, thereby reducing the logic area of the layered LDPC decoder 315. Thus, in the embodiment shown in FIG. 3, the input precision, the precision of the variable node information at location B, the precision of the updated extrinsic information at location C, and the precision of the updated soft information at location D are equal, or substantially equal.

Additionally, in the architecture of the layer processor 315, the known delay compression method described in relation to FIG. 2 cannot be used to ensure frame error performance quality. As mentioned with respect to FIG. 2, for the layer processor 215 to converge, the value stored in the delay element 365 of each layer processor 215 must equal the value at location D minus the value at location B.

To ensure that this condition is met with reduced precision in the main memory 110, the layer processor 315 of an embodiment of the present disclosure includes the selector 380 shown in FIG. 3. When the adder 360 does not overflow, the adder 360 does not generate an overflow signal and the selector 380 selects the extrinsic information output by the check node processor 355 for storage in the delay element 365. Otherwise, when the adder 360 overflows, the adder 360 generates an overflow signal and the selector 380 selects the bitwise inversion of the variable node information output by the inverter 385 for storage in the delay element 365. In a subsequent iteration, when the extrinsic information is removed from the soft information stored in the main memory 110 by the subtractor 350, data at location B is identical to the expected data.

The delay element 365 shown in FIG. 3 stores the modified, reduced precision updated extrinsic information and does not use the prior art compression method described in relation to FIG. 2. As a result, the delay element 365 is easy to implement and eliminates, or substantially eliminates, the routing congestion of the known delay compression method described in relation to FIG. 2 above. Additionally, the delay element 365 has the same operation regardless of the code rate for a programmable rate decoder.

Advantageously, by reducing the input precision of the layer processor 315 to equal the channel precision, the area of the main memory 110 of the iterative LDPC decoder 100 and the logic area of the layer processor 315 are reduced. A consequence of reducing the input precision of the layer processor 315 to equal the channel precision is an increase in the area of the memory of the delay element 365 as the method of using only the first and second check node minimums and their indexes described with respect to FIG. 2 can no longer be used. To mitigate the increase in area of the memory of the delay element 365, an alternative architecture for the layer processor is provided which uses a companding method to mitigate the increase in memory area of the delay element 365. In the present disclosure, compression comprises obtaining an output from a check node, and storing only min and min2, and index values. In contrast, companding is a process in which a set numbers is reduced in size or amount, e.g. made smaller, by erasing some content in the middle of the set. In the description that follows, the term expanding refers to the opposite operation of companding.

Figure 4:
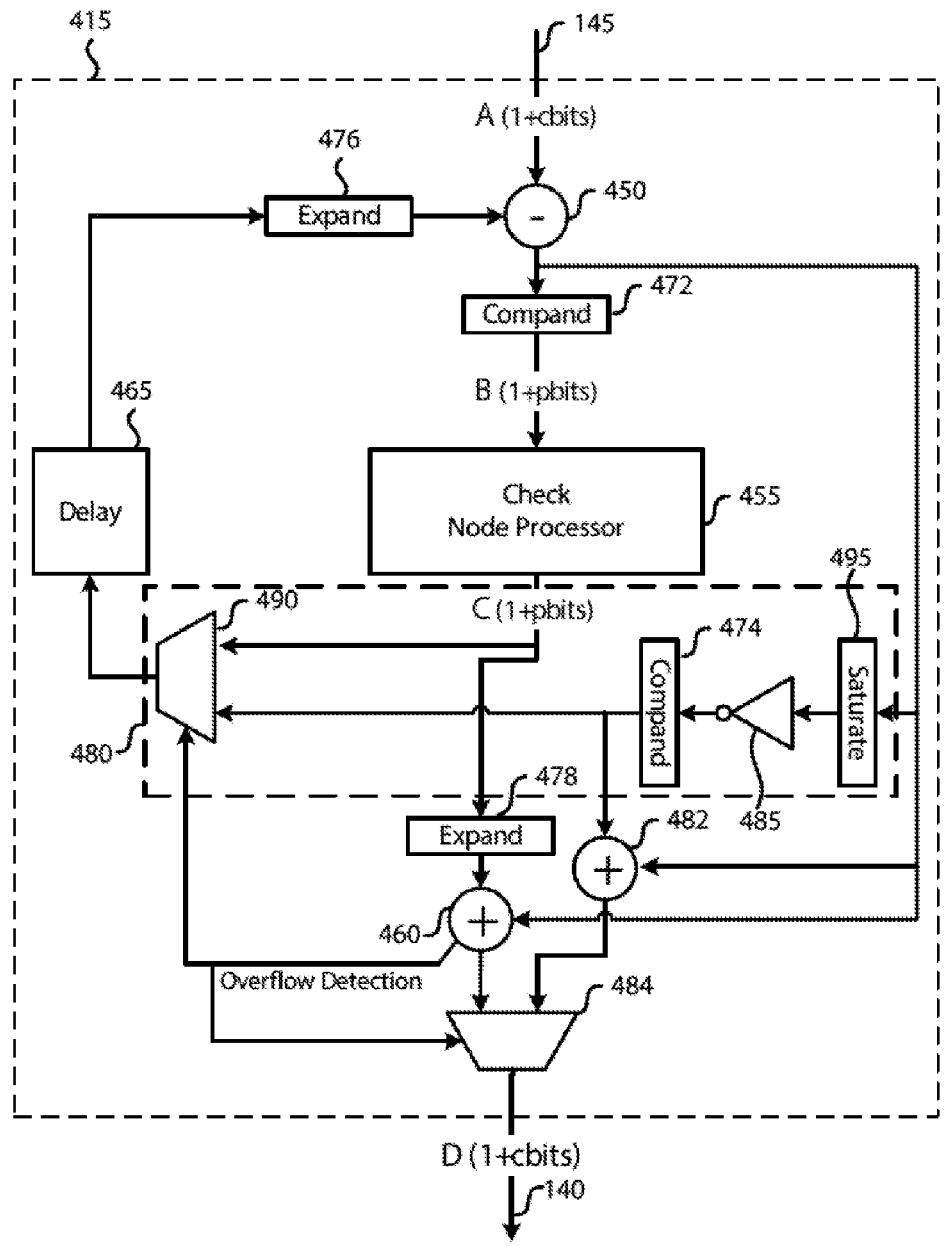
FIG. 4 is a block diagram illustrating a layered LDPC decoder of an iterative LDPC decoder system in accordance with another embodiment of the present disclosure.

FIG. 4 shows a block diagram of another embodiment of a layer processor of an iterative FEC decoder, such as an iterative LDPC decoder, in accordance with the present disclosure. Although FIG. 4 only shows a single layer processor 415 for ease of illustration, a person of ordinary skill in the art will recognize that an iterative LDPC decoder can include one or more layer processors 415, and in some cases a plurality of layer processors 415. In an example implementation, a single layer processor is provided in an LDPC decoder for lower bandwidth applications.

As in the embodiment shown in FIG. 3, the layer processor 415 includes a subtractor 450, a check node processor 455, an adder 460, a delay element 465, a saturation element 495, and a selector 480. The selector 480 includes an inverter 485 and a multiplexor 490.

The layer processor 415 also further includes a first compander 472, a second compander 474, a first expander 476, a second expander 478, a second adder 482, and a second multiplexor 484. A novel companding table is implemented in each of the first compander 472, the second compander 474, the first expander 476, and the second expander 478, as described in further detail below.

In the embodiment shown in FIG. 4, the first compander 472 is connected between an output of the subtractor 450 and an input of the check node processor 455. The first expander 476 is connected between an output of the delay element 465 and the second input of the subtractor 450. The second compander 474, which forms part of the selector 480, is connected between the output of the inverter 495 and the second input of the multiplexor 490. In contrast to the embodiment shown in FIG. 3, the selector 480 includes three inputs and three outputs.

A first input of the selector 480 is operably connected to an output of the check node processor 455 and to a first output of the multiplexor 490. The first output of the selector 480 is also operably connected to an input of the second expander 478. A second input of the selector 480 is operably connected to the output of the subtractor 450 and to an input of the saturation element 495. A third input of the selector 480 is operably connected to an overflow output of the adder 460 and to a select input of the multiplexor 490. A second output of the selector 480 is operably connected to an input of the delay element 465 and to an output of the multiplexor 490. A third output of the selector 480 is operably connected to an output of the second compander 474 and to a first input of the second adder 482.

The adder 482 has two inputs and one output. As mentioned above, the first input of the adder 482 is operably connected to the output of the second compander 474 via the third output of the selector 480. The second input of the adder 482 is operably connected to the output of the subtractor 450 and the output of the adder is connected to a first input of the multiplexor 484.

The overflow output of the adder 460 is operably connected to a select line of the multiplexor 484 and the first output of the adder 460 is operably connected to a second input of the multiplexor 484. The output of the multiplexor 484 is operably connected to the output 140 of the layered LDPC decoder 415.

The operation of each layer processor 415 will now be described with reference to FIG. 4. The layer processor 415 receives soft information from the second output 145 of the main memory 110 at location A. The soft information has a precision that is equal to the channel precision, cbits. The subtractor 450 subtracts the soft information received from the main memory 110 from non-linearly expanded extrinsic information received from the delay element 465 via the first expander 476 to generate variable node information that is provided to the first compander 472. The first compander 472 non-linearly compands the variable node information from a 1+cbits number to a 1+pbits number, and forwards the non-linearly companded variable node information to the check node processor 455. Thus, the non-linearly companded variable node information has a precision, pbits, which is less than the channel precision.

The check node processor 455 receives the non-linearly companded variable node information from the first compander 472 and calculates non-linearly companded updated extrinsic information using a belief propagation method. The second expander 478 receives the non-linearly companded updated extrinsic information from the check node processor 455, non-linearly expands the non-linearly companded updated extrinsic information to a 1+cbits number and 455 and provides the updated extrinsic information to the adder 460. The adder 460 receives the variable node information from the subtractor 450 and the updated extrinsic information from the check node processor 455 and combines the variable node information with the updated extrinsic information to generate updated soft information for the respective layer in a H matrix currently being operated on.

Referring again to FIG. 4, the saturation element 495 receives the variable node information from the subtractor 450 and limits the variable node information to a maximum value that can be used in this layer of the LDPC decoder 415. The inverter 485 performs a bitwise inversion on the variable node information received from the saturation element 495. The second compander 474 non-linearly compands the bitwise inversion on the variable node information and provides the non-linearly compands, bitwise inverted, variable node information to the multiplexor 490.

Combining the non-linearly expanded variable node information with the non-linearly expanded updated extrinsic information can cause the adder 460 to overflow. When the adder 460 overflows, the adder 460 generates an overflow signal. Otherwise, the adder 460 does not generate an overflow signal.

In response to receipt of an overflow signal from the adder 460, the multiplexor 490 feeds back the non-linearly companded, bitwise inverted, variable node information for storage in the delay element 465. Otherwise, absent receipt of an overflow signal from the adder 460, the multiplexor 490 feeds back the non-linearly companded updated extrinsic information received from the check node processor 455 for storage in the delay element 465.

The second adder receives the non-linearly companded, bitwise inverted, variable node information from the second compander 474 and the variable node information from the subtractor 450, and combines the non-linearly companded, bitwise inverted, variable node information with the variable node information.

The second multiplexor 484 receives the updated soft information from the adder 460 and the output of adder 482. Absent receipt of an overflow signal from the adder 460, the second multiplexor 484 outputs the updated soft information received from the adder 460. In response to receipt of an overflow signal from the adder 460, the second multiplexor 484 outputs the output of adder 482 received from the second adder 482.

In the embodiment shown in FIG. 4, the first and second companders 472, 474 map the variable node information LLRs from a 1+cbits number into a 1+pbits number, where cbits is the number of magnitude bits in the raw data received from the channel and pbits is the target number of bits in the first and second companders 472, 474. In order to perform a companding that minimizes the impact of the companding on the frame error rate performance, a non-linear companding is performed. For example, with cbits=4 and pbits=3 a linear companding would simply divide all inputs by 2, essentially losing precision of all LLR values by a bit and capping the maximum LLR to a value of 8 in the pbits space. A non-linear companding sacrifices precision at selected LLR values to gain dynamic range. For good decoding performance it is critical to maintain accuracy for smaller values but less critical to maintain accuracy for larger values.

Considering the above, a mapping as shown below in Table 1 is an example that can be used to compand a 4-bit magnitude value down to a 3-bit value.

TABLE 1

Sample Companding Table for 4-bit to 3-bit Magnitude

| Input | Output |
|---|---|
| 0 | 0 |
| 1 | 1 |
| 2 | 2 |
| 3 | 3 |
| 4 | 4 |
| 5 | 4 |
| 6 | 6 |
| 7 | 6 |
| 8 | 8 |
| 9 | 8 |
| 10 | 10 |
| 11 | 10 |
| 12 | 10 |
| 13 | 10 |
| 14 | 10 |
| 15 | 10 |

As shown in Table 1, the companded LLRs 5, 7, 9, and 11-15 are not as accurate as the original LLRs; however, the arrangement permits representation of an LLR strength greater than 8 (i.e. 10) in this case. If the LLRs in the mapped space are monotonically increasing then the values into the check node can be companded without modifying the check node processor 455. The logic area requirements of the check node processor 455 as well as the area of the memory storage elements of the delay element 465 can therefore be decreased. In order to ensure that the feedback rule location D-location B is enforced, it is desirable to compand the bitwise output from inverter 485.

The companded inverted value represents the maximum companded value that can be added to the companded variable node information received from the first compander 472 without overflowing the value at the output 140 of the layered LDPC decoder 415. Since the mapping is non-linear it is either desirable to expand the 1+pbits companded values to their non-companded 1+cbits counterparts, or alternatively, to implement a customized arithmetic adder and subtractor in the layer processor 415 that ensures the correct output value is produced given its inputs.

The embodiment shown in FIG. 4 allows for simple unpacking procedures when reading from the delay element 465. In the compression method described in relation to FIG. 2, Min, Min2, the Min Index and all of the sign bits are read for the entire check node. The number of inputs for a given check node depends on the rate of the code being used. Higher rate LDPC codes have higher degree check node orders, often 64 or more inputs, while lower rate codes can have 16 or even fewer inputs. All of these values must be unpacked and routed large distances to create the desired LLR value that is subtracted at the start of the layer processor 415. In the embodiment shown in FIG. 4, each of the different check node inputs has a unique value stored in the delay element 465, thereby removing the need for unpacking circuitry and lengthy routing delays for values read from the delay element 465.

Figure 5:
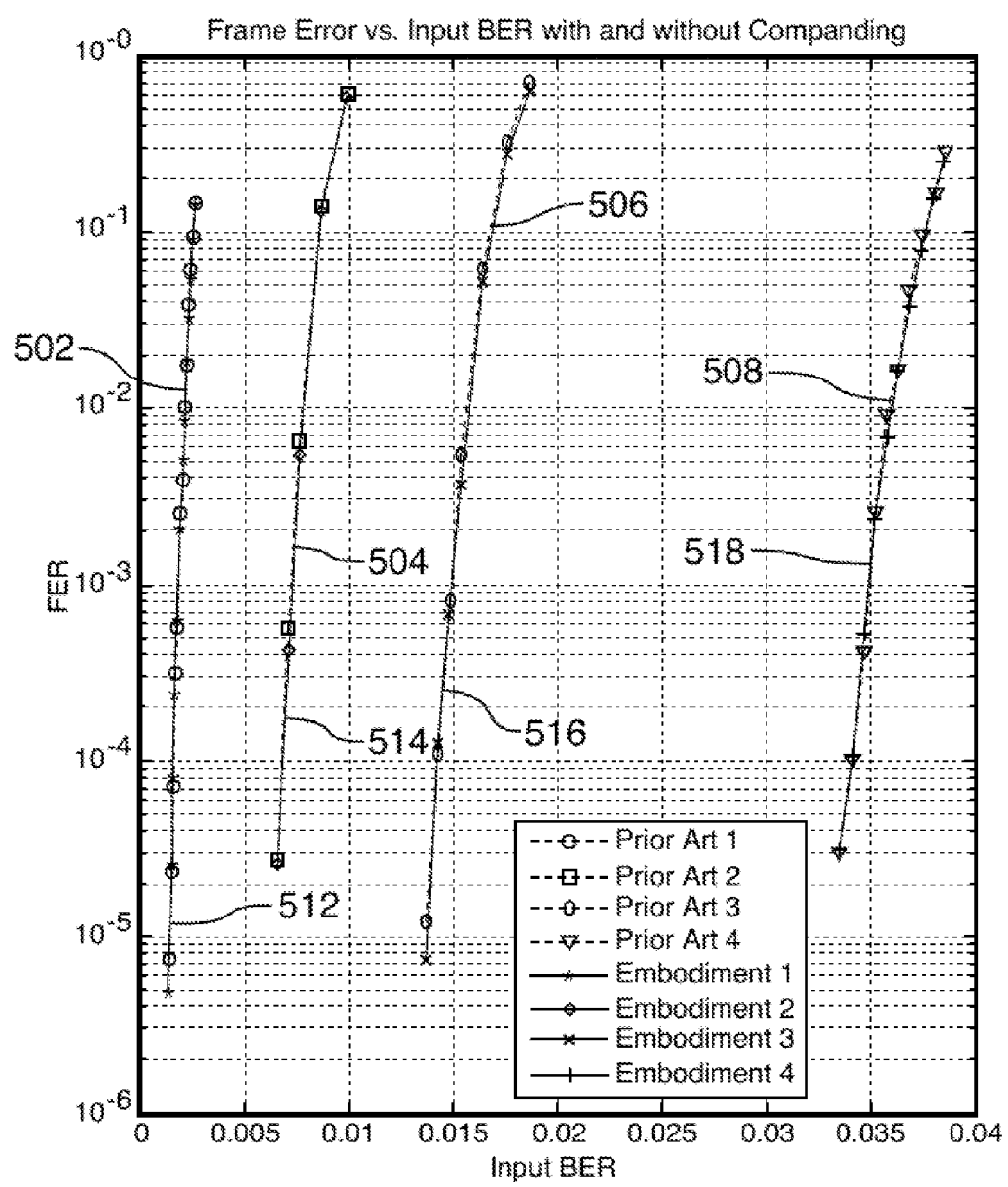
FIG. 5 is a graph comparing frame error rate performance versus the input bit error rate (BER) for the known layer processor of FIG. 2, and the layer processor of the embodiments described with respect to FIG. 4.

FIG. 5 is a graph comparing frame error rate performance versus the input bit error rate (BER) for the prior art layer processor 215 of FIG. 2, and the layer processor 415 of the embodiments described with respect to FIG. 4. The data shown in FIG. 5 was obtained using four different LDPC code rates. Dashed lines 502, 504, 506, and 508 represent simulation runs with 4-bit channel data, vbits=6 and cbits=4 for the four different LDPC codes rates using the known compression method described with reference to FIG. 2.

Solid lines 512, 514, 516, and 518 represent simulations using the layer processor architecture shown in FIG. 4 with 4-bit channel data, cbits=4 bits and pbits=3 bits, mapped with the companding in Table 1. Using layer processor internal precision reduction in conjunction with companded output of the second delay element 465 reduces the area and power requirements of the layer processor without impacting the frame error performance of the iterative LDPC decoder. FIG. 5 demonstrates that with small dynamic ranges as in embodiments of the present disclosure, good performance can be maintained.

Advantageously, the LDPC decoder of an embodiment of the present disclosure achieves excellent FER performance while minimizing implementation area. The LDPC decoder of an embodiment of the present disclosure reduces the area of the main memory and the power utilized by the layer processor without impacting the frame error rate performance of the decoding operation. Also, the LDPC decoder of an embodiment of the present disclosure provides a reduced logical area by utilizing 30% smaller soft value precision than known architectures of LDPC system decoders.

The LDPC decoder of an embodiment as presented in the present disclosure may be deployed in any communication systems that employs iterative decoder error correction and is especially well suited to high throughput systems where minimizing implementation area is critical or where minimizing power consumption is critical. The LDPC decoder of an embodiment of the present disclosure may be implemented as an Application Specific Integrated Circuit (ASIC), a Programmable Gate Array, or some combination of an Integrated Circuit, a Programmable Gate Array, and software and may be included in systems such as, but not limited to: Optic Fiber based Metro and Wide Area Networks (MANs and WANs); Flash memory Physical Layer; and wireless communication systems.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A Low Density Parity Check (LDPC) decoder comprising:
 a main memory for storing raw data received from a channel as soft information, the raw data received from the channel having a channel bit width;
 one or more layer processors, each of the one or more layer processors being operably coupled to the main memory and comprising:
  an input for receiving the soft information from the main memory, the soft information having an input bit width that is equal to the channel bit width;
  a delay element having a storage element for storing extrinsic information;
  a subtractor configured to subtract the extrinsic information stored in the delay element from the soft information received from the main memory to generate variable node information, the variable node information having a variable node information bit width that is less than or equal to the channel bit width;
  a check node processor configured to receive the variable node information from the subtractor and to calculate updated extrinsic information using a belief propagation method, the updated extrinsic information having an extrinsic information bit width that is less than or equal to the channel bit width;
  an adder configured to combine the variable node information received from the subtractor with the updated extrinsic information received from the check node processor to generate updated soft information;
  a selector configured to:
   in response to receipt of an overflow signal from the adder, feedback a bitwise inversion of the variable node information received from the subtractor to the delay element for storage therein;
   absent receipt of the overflow signal from the adder, feedback the updated extrinsic information to the delay element for storage therein; and
  an output for providing the updated soft information received from the adder to the main memory to replace the soft information stored in the main memory, the updated soft information having an updated soft information bit width that is equal to the channel bit width.

2. The LDPC decoder according to claim 1, wherein each of the one or more layer processors further comprises:
 a first saturation element configured to receive the variable node information from the subtractor and to limit the variable node information bit width such that the variable node information bit width equals the channel bit width.

3. The LDPC decoder according to claim 2, wherein each of the one or more layer processors further comprises:
 a second saturation element configured to receive the updated soft information from the adder and to limit the updated soft information bit width such that the precision of the updated soft information equals the channel bit width.

4. The LDPC decoder according to claim 3, wherein the selector of each of the one or more layer processors comprises:
 a third saturation element operably coupled to an output of the subtractor and configured to limit the variable node information bit width of the variable node information received from the subtractor such that the variable node information bit width equals the channel bit width;
 an inverter operably coupled to an output of the third saturation element and configured to perform the bitwise inversion of the variable node information received from the third saturation element; and
 a multiplexor operably coupled to the check node processor, the inverter and the adder and configured to:
  in response to receipt of the overflow signal from the adder, output the bitwise inversion of the variable node information received from the third saturation element; and
  absent receipt of the overflow signal from the adder, output the updated extrinsic information.

5. The LDPC decoder according to claim 1, wherein each of the one or more layer processors further comprises:
- a first expander configured to non-linearly expand the extrinsic information received from the delay element such that the extrinsic information bit width of the extrinsic information received from the delay element is equal to the channel bit width;
- a first compander configured to:
  - non-linearly compand the variable node information received from the subtractor such that the variable node information bit width is less than the channel bit width; and
  - forward the non-linearly companded variable node information to the check node processor;
- a second expander configured to non-linearly expand the updated extrinsic information received from the check node processor such the updated extrinsic information bit width of the updated extrinsic information is equal to the channel bit width.

6. The LDPC decoder according to claim 5, wherein the selector of each of the one or more layer processors comprises:
- a saturation element operably coupled to an output of the subtractor and configured to limit the variable node information bit width of the variable node information received from the subtractor such that the variable node information bit width equals the channel bit width;
- an inverter operably coupled to an output of the saturation element and configured to perform a bitwise inversion on the variable node information received from the saturation element;
- a second compander operably coupled to the inverter and configured to:
  - non-linearly compand the bitwise inversion of the variable node information such that the bitwise inversion of the variable node information has a bitwise inversion bit width that is less than the channel bit width;
- a multiplexor operably coupled to the check node processor, the second compander and the adder and configured to:
  - in response to receipt of the overflow signal from the adder, output the non-linearly companded bitwise inversion of the variable node information received from the second compander;
  - absent receipt of the overflow signal from the adder, output the non-linearly expanded updated extrinsic information received from the check node processor.

7. A method of decoding raw data received from a channel, the method comprising:
- storing the raw data in a main memory as soft information, the raw data having a channel bit width;
- obtaining the soft information from the main memory, the soft information retrieved from the main memory having a soft information bit width that is equal to the channel bit width;
- subtracting extrinsic information, stored in a delay element comprising a storage element, from the soft information received from the main memory to generate variable node information, the variable node information having a variable node information bit width that is less than or equal to the channel bit width;
- processing the variable node information using a belief propagation method to obtain updated extrinsic information, the updated extrinsic information having an updated extrinsic information bit width that is less than or equal to the channel bit width;
- combining the variable node information with the updated extrinsic information to generate updated soft information;
- if combining the variable node information with the updated extrinsic information results in an overflow condition:
  - saturating the variable node information to limit the variable node information bit width of the variable node information to a maximum value; and
  - storing a bitwise inversion of the maximum value of the variable node information;
- otherwise: storing the updated extrinsic information; and
- replacing the soft information stored in the main memory with the updated soft information, the updated soft information having an updated soft information bit width that is equal to the channel bit width.

8. The method of claim 7, further comprising:
saturating the generated variable node information to limit the variable node information bit width of the generated variable node information such that the variable node information bit width is equal the channel bit width.

9. The method of claim 8, further comprising:
saturating the updated soft information to limit the updated soft information bit width of the updated soft information such that the updated soft information bit width is to equal the channel bit width.

10. The method of claim 7, further comprising:
- non-linearly expanding the extrinsic information received from the delay element such that an extrinsic information bit width of the extrinsic information received from the delay element is equal to the channel bit width;
- non-linearly companding the variable node information to generate non-linearly companded variable node information such that the variable node information bit width is less than the channel bit width;
- non-linearly companding the bitwise inversion of the maximum value of the variable node information such that a bitwise inversion bit width of the bitwise inversion inverted maximum value of the variable node information is less than the channel bit width; and
- non-linearly expanding the updated extrinsic information such that the updated extrinsic information bit width is equal to the channel bit width; and
- wherein processing the channel information using a belief propagation method to obtain the updated extrinsic information comprises processing the non-linearly companded variable node information to obtain non-linearly companded updated extrinsic information.

11. A non-transitory computer-readable medium having computer-readable instructions stored thereon executable by a layered Low Density Parity Check (LDPC) decoder to perform a method of decoding raw data received from a channel that is stored in a memory as soft information, the raw data having a channel bit width, the method comprising:
- obtaining the soft information from the main memory, the soft information retrieved from the main memory having a soft information bit width that is equal to the channel bit width;
- subtracting extrinsic information, stored in the delay element having a storage element, from the soft information received from the main memory to generate variable node information, the variable node information having a variable node information bit width that is less than or equal to the channel bit width;
- processing the generated variable node information using a belief propagation method to obtain updated extrinsic information, the updated extrinsic information having an updated extrinsic information bit width that is less than or equal to the channel bit width;

combining the variable node information with the updated extrinsic information to generate updated soft information;

if combining the variable node information with the updated extrinsic information results in an overflow condition:

saturating the variable node information to limit the precision of the variable node information to a maximum value; and storing a bitwise inversion of the maximum value of the variable node information;

otherwise: storing the updated extrinsic information; and replacing the soft information stored in the main memory with the updated soft information, the updated soft information having an updated soft information bit width that is equal to the channel bit width.

12. The non-transitory computer-readable medium according to claim 11, wherein the method further comprises:

saturating the generated variable node information to limit the variable node information bit width of the generated variable node information such that the variable node information bit width is to equal the channel bit width.

13. The non-transitory computer-readable medium according to claim 11, wherein the method further comprises:

saturating the updated soft information to limit of the updated soft information bit width such that the updated soft information bit width is to equal the channel bit width.

14. The non-transitory computer-readable medium according to claim 11, wherein the method further comprises:

non-linearly expanding the extrinsic information such that an extrinsic information bit width the extrinsic information received from the delay element is equal to the channel bit width;

non-linearly companding the variable node information to generate non-linearly companded variable node information such that the variable node information bit width is less than the channel bit width;

non-linearly companding the bitwise inversion of the maximum value of the variable node information such that a bitwise inversion bit width of the bitwise inversion of the maximum value of the variable node information is less than the channel bit width; and non-linearly expanding the updated extrinsic information such that of the updated extrinsic information bit width is equal to the channel bit width;

wherein processing the variable node information using a belief propagation method to obtain updated extrinsic information comprises processing the non-linearly companded variable node information to obtain non-linearly companded updated extrinsic information.

15. A Low Density Parity Check (LDPC) decoder comprising:

a main memory storing raw data received from a channel as soft information, the raw data received from the channel having a channel bit width;

one or more layer processors, each of the one or more layer processors being operably coupled to the main memory and having:

a subtractor configured to subtract extrinsic information the soft information received from the main memory to generate variable node information a first saturation element configured to receive the variable node information from the subtractor and to limit a variable node information bit width of the variable node information such that the variable node information bit width equals the channel bit width;

a check node processor configured to receive the variable node information from the first saturation element and to calculate updated extrinsic information using a belief propagation method;

an adder configured to combine the variable node information received from the subtractor with the updated extrinsic information received from the check node processor to generate updated soft information; and a second saturation element configured to receive the updated soft information from the adder and to limit an updated soft information bit width of the updated soft information such that the updated soft information bit width equals the channel bit width;

wherein each of the one or more layer processors iteratively decodes the soft information such that, during the iterative decoding, the soft information bit width received from the memory is equal to the channel bit width and the variable node information bit width of variable node information generated by the iterative decoding.

* * * * *